(12) United States Patent
Stone et al.

(10) Patent No.: US 10,157,764 B2
(45) Date of Patent: Dec. 18, 2018

(54) THERMAL SHIELD FOR ELECTROSTATIC CHUCK

(71) Applicant: Varian Semiconductor Equipment Associates, Inc., Gloucester, MA (US)

(72) Inventors: Dale K. Stone, Lynnfield, MA (US); David J. Chipman, Lynn, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 242 days.

(21) Appl. No.: 15/174,160

(22) Filed: Jun. 6, 2016

(65) Prior Publication Data

US 2016/0379861 A1  Dec. 29, 2016

Related U.S. Application Data

(60) Provisional application No. 62/186,068, filed on Jun. 29, 2015.

(51) Int. Cl.
| | |
|---|---|
| *H01L 21/683* | (2006.01) |
| *H02N 13/00* | (2006.01) |
| *H01L 21/67* | (2006.01) |
| *G03F 7/20* | (2006.01) |

(52) U.S. Cl.
CPC .... *H01L 21/6833* (2013.01); *H01L 21/67103* (2013.01); *H02N 13/00* (2013.01); *G03F 7/70708* (2013.01); *H01L 21/6831* (2013.01)

(58) Field of Classification Search
USPC ................................................ 361/230, 231
See application file for complete search history.

(56) References Cited

U.S. PATENT DOCUMENTS

| 7,033,444 B1 | 4/2006 | Komino et al. |
| 2003/0047283 A1* | 3/2003 | Parkhe ................ C23C 16/4581 |
| | | 156/345.51 |
| 2005/0211385 A1 | 9/2005 | Benjamin et al. |
| 2010/0103584 A1 | 4/2010 | Nam |
| 2013/0072024 A1 | 3/2013 | Ricci et al. |
| 2013/0168595 A1* | 7/2013 | Chang .................. C03C 17/007 |
| | | 252/62 |

(Continued)

FOREIGN PATENT DOCUMENTS

JP  2000-44345 A  2/2000

OTHER PUBLICATIONS

International Search Report and Written Opinion dated Aug. 24, 2016 in corresponding PCT application No. PCT/US2016/036000.

*Primary Examiner* — Danny Nguyen
(74) *Attorney, Agent, or Firm* — Nields, Lemack & Frame, LLC

(57) ABSTRACT

A thermal shield is disclosed that may be disposed between a heated electrostatic chuck and a base. The thermal shield comprises a thermal insulator, such as a polyimide film, having a thickness of between 1 and 5 mils. The polyimide film is coated on one side with a layer of reflective material, such as aluminum. The layer of reflective material may be between 30 and 100 nanometers. The thermal shield is disposed such that the layer of reflective material is closer to the chuck. Because of the thinness of the layer of reflective material, the thermal shield does not retain a significant amount of heat. Further, the temperature of the thermal shield remains far below the glass transition temperature of the polyimide film.

19 Claims, 1 Drawing Sheet

(56) References Cited

U.S. PATENT DOCUMENTS

2014/0159325 A1\* 6/2014 Parkhe .............. H01L 21/67109
  279/128
2016/0035610 A1\* 2/2016 Park ................... H01L 21/6833
  156/345.29

\* cited by examiner

THERMAL SHIELD FOR ELECTROSTATIC CHUCK

This application claims priority of U.S. Provisional Application Ser. No. 62/186,068 filed Jun. 29, 2015, the disclosure of which is incorporated herein by reference in its entirety.

FIELD

Embodiments of the present disclosure relate to thermal shields for electrostatic chucks, and more particularly, to thermal shields for insulating a heated electrostatic chuck from a base.

BACKGROUND

The fabrication of a semiconductor device involves a plurality of discrete and complex processes. The semiconductor substrate typically undergoes many processes during the fabrication process. As a substrate is being processed, the substrate is typically clamped to a chuck. This clamping may be mechanical or electrostatic in nature. The electrostatic chuck traditionally consists of a plurality of layers. The top layer, also referred to as the top dielectric layer, contacts the substrate, and is made of an electrically insulating or semi-conducting material, since it produces the electrostatic field without creating a short circuit. To create the electrostatic force, a plurality of electrodes may be disposed beneath the top dielectric layer. The plurality of electrodes is constructed from an electrically conductive material, such as a metal.

In certain applications, ion implantation may result in crystal defects and amorphization. This crystalline damage can often be restored by thermal processing, known as annealing. However, for certain high dose implants and device structures, typical post-implant annealing may not be sufficient to restore all the damage caused by the implantation. Heating the substrate during the implant process is known to reduce damage to the substrate and to preserve more of the crystalline structure to facilitate regrowth during the anneal process.

Substrates are typically heated by contact, such as through the use of a gas trapped between the workpiece and the chuck, such as when the substrate is held in place by electrostatic forces. The substrate may also be directly heated by the chuck. In both embodiments, heat is applied to the lower surface of the substrate by the chuck. Thus, the chuck is maintained at an elevated temperature to cause the substrate to be heated.

However, in certain embodiments, the heated chuck is in close proximity with a base. In certain embodiments, the heated chuck may be about 3/8" thick, and may be heated to about 500° C. or more. The base may also be about 3/8" in thickness and may be at or near room temperature through the use of water cooling.

The chuck and the base may be separated by about 1/8" or less, such as through the use of ceramic washers, which are poor thermal conductors. The temperature difference between the heated chuck and the base may be hundreds of degrees. The base may act as a thermal sink, drawing heat from the chuck. In certain embodiments, a metal thermal shield is disposed between the heated chuck and the base. However, traditional metal thermal shields may be problematic. For example, because metal is an excellent thermal conductor, the metal thermal shield may be heated to nearly the temperature of the chuck. This may cause deformation of the metal thermal shield and possible contact between the metal thermal shield and the chuck or the metal thermal shield and the base. Because the chuck is typically made of ceramic materials, this may cause thermal stress to the chuck, which may lead to material fatigue or cracking.

It would be beneficial if there were a thermal shield that effectively thermally isolated the heated chuck from the base. Further, it would be beneficial if this thermal shield allowed the chuck and the base to be in close proximity without deforming.

SUMMARY

A thermal shield is disclosed that may be disposed between a heated electrostatic chuck and a base. The thermal shield comprises a thermal insulator, such as a polyimide film, having a thickness of between 1 and 5 mils. The polyimide film is coated on one side with a layer of reflective material, such as aluminum. The layer of reflective material may be between 30 and 100 nanometers. The thermal shield is disposed such that the layer of reflective material is closer to the electrostatic chuck. Because of the thinness of the layer of reflective material, the thermal shield does not retain a significant amount of heat. Further, the temperature of the thermal shield remains far below the glass transition temperature of the polyimide film.

In accordance with one embodiment, an apparatus is disclosed. The apparatus comprises an electrostatic chuck; a base, at a lower temperature than the electrostatic chuck; and a thermal shield disposed between the electrostatic chuck and the base, where the thermal shield comprises a polyimide film that is coated, on one side, with a layer of reflective material. In certain embodiments, the layer of reflective material comprises aluminum. In certain embodiments, the layer of reflective material is deposited on the polyimide film using chemical vapor deposition, physical vapor deposition, plasma enhanced chemical vapor deposition or e-beam evaporation. In certain embodiments, the layer of reflective material is between 30 and 100 nanometers. In certain embodiments, the polyimide film has a thickness of between 1 and 5 mils. In certain embodiments, washers are used to separate the thermal shield from at least one of the electrostatic chuck and the base. In certain embodiments, the chuck is heated to a temperature greater than 200° C.

In accordance with another embodiment, an apparatus is disclosed. The apparatus comprises an electrostatic chuck; a base, at a lower temperature than the electrostatic chuck, and spaced apart from the electrostatic chuck; a thermal shield disposed between the electrostatic chuck and the base, where the thermal shield comprises a polyimide film that is coated, on a side facing the electrostatic chuck, with a layer of reflective material; and washers to separate the thermal shield from the electrostatic chuck and the base. In certain embodiments, the chuck is heated to a temperature greater than 200° C.

In accordance with another embodiment, an apparatus is disclosed. The apparatus comprises an electrostatic chuck; a base, at a lower temperature than the electrostatic chuck; and a thermal shield disposed between the electrostatic chuck and the base, where the thermal shield comprises a thermal insulator that is coated, on a side closer to the electrostatic chuck, with a layer of reflective material. In certain embodiments, the insulator has a thickness of between 1 and 5 mils.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
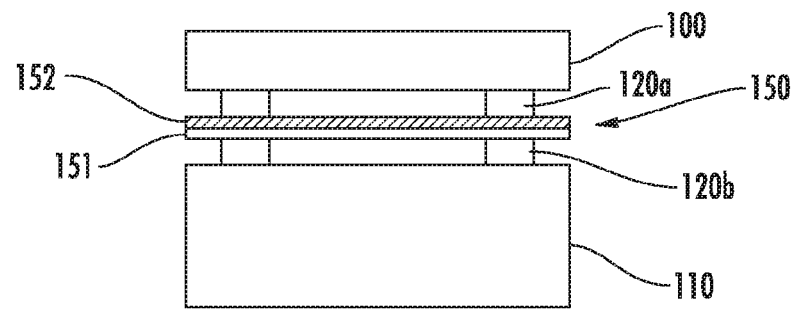
FIG. 1 is a side view of the thermal shield disposed between the chuck and the base according to one embodiment.

As described above, in many applications, it may be advantageous to heat the substrate while the substrate is clamped to an electrostatic chuck. Traditionally, this heating is performed using conduction, where the heat contained in the electrostatic chuck is transferred to the substrate, often through the use of back side gas.

As described above, there may be a large temperature difference between the electrostatic chuck, where the substrate is disposed, and the base, which provides the electrical and fluid connections to the electrostatic chuck. In some embodiments, this issue is addressed by separating the heated chuck from the base by a large distance, so that there is a temperature gradient between the two components. However, in some embodiments, space may not be available to provide sufficient separation. For example, in certain embodiments, the space between the chuck and the base may be ⅛" or less. In these embodiments, the resulting temperature gradient may adversely affect the life of the chuck.

The present disclosure addresses these issues by disposing a thermal shield between the heated chuck and the base. However, as described above, traditional metal thermal shields may be problematic. Because of this, the present disclosure discloses the use of novel thermal shields.

In contrast to traditional metal shields, the present thermal shields are made from a thermal insulator, such as a polyimide material. Polyimide materials are excellent thermal insulators and therefore, are less susceptible to the deformation experienced by traditional metal shields. Further, polyimide materials have high operating temperatures. For example, the glass transition temperature (Tg) of many polyimide materials is over 350° C. In certain embodiments, the polyimide material used for the thermal shield may be formed as a film having a thickness of between 1 and 5 mils. Polyimide materials include KAPTON® and other materials.

To further enhance the operation of the thermal shield, the polyimide film is coated, on one side, with a highly reflective material. For example, in certain embodiments, a layer of aluminum is deposited on one side of the polyimide film. This layer of aluminum may be deposited using a chemical vapor deposition (CVD) process, a plasma enhanced chemical vapor deposition (PECVD) process, a physical vapor deposition (PVD) process or e-beam evaporation. The thickness of the layer of aluminum may be between 30-100 nm, although other thicknesses are within the scope of the disclosure.

The highly reflective material may have a mirror-like finish and may have a very high level of reflectivity. This highly reflective material tends to reflect the heat from the chuck back toward the chuck.

Additionally, because the layer of reflective material is thin, the layer does not conduct thermal energy as well as traditional metal shields, which may be much thicker, such as 0.030". As a result, the layer of reflective material does not absorb a significant amount of heat. Therefore, the temperature of the thermal shield remains much lower than the temperature of traditional metal shields. In certain tests, the operating temperature of the present thermal shield was measured as a function of the temperature of the chuck. Results are shown in Table 1.

TABLE 1

| Electrostatic Chuck Temperature | Shield Temperature |
| --- | --- |
| 100° C. | 31-33.5° C. |
| 200° C. | 44-51.8° C. |
| 300° C. | 65-79.1° C. |
| 350° C. | 85-95.3° C. |
| 400° C. | 92-112.5° C. |
| 450° C. | 110-132.6° C. |
| 500° C. | 127-154° C. |

In some embodiments, as shown in Table 1, the chuck is heated to a temperature greater than 100° C. In certain embodiments, the chuck is heated to a temperature greater than 200° C. In certain embodiments, the chuck is heated to a temperature greater than 300° C. In certain embodiments, the chuck is heated to a temperature greater than 350° C. In certain embodiments, the chuck is heated to a temperature greater than 400° C. In certain embodiments, the chuck is heated to a temperature greater than 450° C. In certain embodiments, the chuck is heated to a temperature greater than 500° C. In all of these tests, the thermal shield remained below 200° C., even when the chuck was heated to 500° C. Further, because of the Tg of polyimide materials is greater than 300° C., there is a high margin of safety.

Further, while polyimide materials are described above, other thermal insulating materials may be used. For example, polyesters may also be used.

FIG. 1 shows one embodiment. In this figure, a chuck 100 is disposed above, and separate from, a base 110. As described above, the chuck 100 may be heated to temperatures in excess of 500° C., while the base 110 may be water cooled to maintain a temperature close to room temperature. The chuck 100 and the base 110 may be separated by a distance of between about 1/16" and ⅛". The thermal shield 150 is disposed between the chuck 100 and the base 110. In this embodiment, the thermal shield 150 is separated from the chuck 100 by a first set of washers 120a. The thermal shield 150 is separated from the base 110 by a second set of washers 120b. In certain embodiments, the washers 120a, 120b may be ceramic, which are also poor thermal conductors. In some embodiments, the thermal shield 150 is disposed halfway between the chuck 100 and the base 110, such that the first set of washers 120a are the same height as the second set of washers 120b. Of course, the thermal shield 150 may be moved closer to the chuck 100 by deploying a second set of washers 120b which are taller than the first set of washers 120a. Alternatively, the thermal shield 150 may be disposed closer to the base 110 by employing a first set of washers 120a which are taller than the second set of washers 120b.

The thermal shield 150 may be made of a thermal insulator, such as a polyimide film 151, which is coated, on one side, with a layer of reflective material 152. The layer of reflective material 152 is disposed on the side of the polyimide film 151 that is closer to the chuck 100, such that heat radiated by the chuck 100 is reflected back toward the chuck 100. As described above, in certain embodiments, the layer of reflective material 152 may be a layer of aluminum that may be deposited using a chemical vapor deposition (CVD) process, a plasma enhanced chemical vapor deposition (PECVD) process, a physical vapor deposition (PVD) process or e-beam evaporation. The thickness of the layer of reflective material 152 may be between 30-100 nm, although other thicknesses are within the scope of the disclosure. Additionally, other reflective materials, such as other metals including but not limited to silver and copper, may also be used. The overall thickness of the thermal shield 150 may be between 1 and 5 mils.

Figure 2:
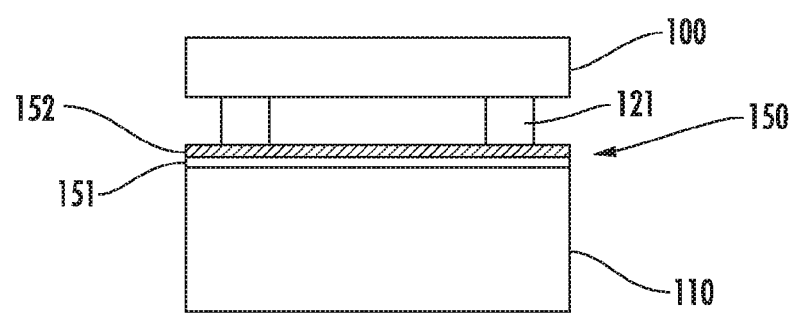
FIG. 2 is a side view of the thermal shield disposed between the chuck and the base according to another embodiment.

FIG. 2 shows a second embodiment. In this embodiment, chuck 100 and the base 110 may be separated by a distance of between about 1/16" and 1/8". Further, in this embodiment, the thermal shield 150 is disposed directly on the base 110. The polyimide film 151 is disposed directly on the base 110, while the layer of reflective material 152 is disposed on the side of the polyimide film 151 that is closer to the chuck 100. In this embodiment, the height of each washer 121 may be roughly equal to the combined height of the washer 120a and washer 120b.

Figure 3:
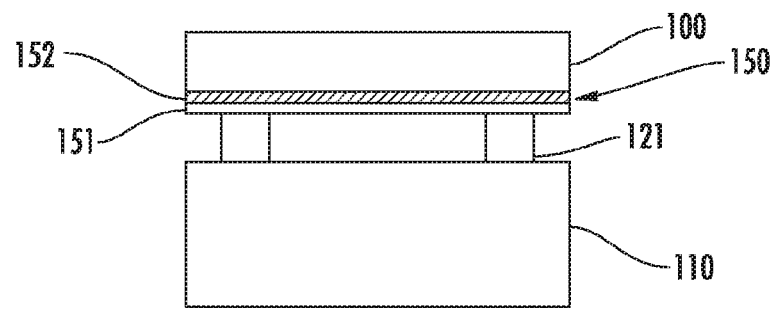
FIG. 3 is a side view of the thermal shield disposed between the chuck and the base according to a third embodiment.

FIG. 3 shows a third embodiment. In this embodiment, chuck 100 and the base 110 may be separated by a distance of between about 1/16" and 1/8". Further, in this embodiment, the thermal shield 150 is disposed directly on the chuck 100. The layer of reflective material 152 is disposed directly on the chuck 100, while the polyimide film 151 is disposed closer to the base 110. In this embodiment, the height of each washer 121 may be roughly equal to the combined height of the washer 120a and washer 120b.

Thus, in all embodiments, the thermal shield 150 is disposed between the chuck 100, which may be heated, and the base 110, which is maintained at a lower temperature than the chuck 100. Further, in certain embodiments, the thermal shield 150 comprises a polyimide film 151, which is coated, on one side, with a layer of reflective material 152. In each embodiment, the layer of reflective material 152 is disposed on the side of the polyimide film 151 that is disposed closer to the chuck 100. Further, washers are used to hold the thermal shield 150 in place. In certain embodiments, such as that shown in FIG. 1, washers 120a, 120b are disposed on both sides of the thermal shield 150 so that the thermal shield 150 is separated from both the chuck 100 and the base 110. In other embodiments, such as those shown in FIGS. 2 and 3, washers 121 are only disposed on one side of the thermal shield 150, such that the thermal shield is disposed directly on one of the chuck 100 and the base 110. As noted above, materials other than polyimide film may be used. Thus, in all embodiments, the thermal shield may be a thermal insulator that is coated on one side with a layer of reflective material.

The embodiments described above in the present application may have many advantages. First, as described above, the present thermal shield absorbs far less heat than traditional metal thermal shields. Because of this, the present thermal shield serves as a better thermal insulator between the chuck and the base than traditional heat shields. Further, traditional metal thermal shields are heated by the chuck and tend to deform. This deformation may cause the traditional thermal shield to come in physical contact with the base or the chuck, which may impact its effectiveness. The present thermal shield operates at a significantly lower temperature, which is far below the glass transition temperature of the polyimide film, insuring a large margin of safety. Further, even if there is physical contact between the thermal shield and the chuck, there are no ill effects due to the low heat transfer. Additionally, the use of the present thermal shield allows a very small separation between the chuck, which is heated, and the base, which may be at room temperature.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An apparatus comprising:
an electrostatic chuck;
a base, at a lower temperature than the electrostatic chuck;
a thermal shield disposed between the electrostatic chuck and the base, where the thermal shield comprises a polyimide film that is coated, on one side, with a layer of reflective material; and
one or more washers, where the washers separate the thermal shield from the electrostatic chuck,
wherein the thermal shield is disposed such that the reflective material is closer to the electrostatic chuck such that heat radiated by the electrostatic chuck is reflected back toward the electrostatic chuck.

2. The apparatus of claim 1, wherein the layer of reflective material comprises aluminum.

3. The apparatus of claim 1, wherein the layer of reflective material is deposited on the polyimide film using chemical vapor deposition, physical vapor deposition, plasma enhanced chemical vapor deposition or e-beam evaporation.

4. The apparatus of claim 1, wherein the layer of reflective material is between 30 and 100 nanometers.

5. The apparatus of claim 1, wherein the polyimide film has a thickness of between 1 and 5 mils.

6. The apparatus of claim 1, wherein washers are used to separate the thermal shield from the base.

7. The apparatus of claim 1, wherein the electrostatic chuck and the base are separated by a distance of between 1/16" and 1/8".

8. The apparatus of claim 1, wherein the electrostatic chuck is heated to a temperature greater than 200° C.

9. An apparatus comprising:
an electrostatic chuck;
a base, at a lower temperature than the electrostatic chuck, and spaced apart from the electrostatic chuck;
a thermal shield disposed between the electrostatic chuck and the base, where the thermal shield comprises a polyimide film that is coated, on a side facing the electrostatic chuck, with a layer of reflective material; and
washers to separate the thermal shield from the electrostatic chuck and the base.

10. The apparatus of claim 9, wherein the layer of reflective material comprises aluminum.

11. The apparatus of claim 9, wherein the layer of reflective material is deposited on the polyimide film using chemical vapor deposition, physical vapor deposition, plasma enhanced chemical vapor deposition or e-beam evaporation.

12. The apparatus of claim 9, wherein the layer of reflective material is between 30 and 100 nanometers.

13. The apparatus of claim 9, wherein the polyimide film has a thickness of between 1 and 5 mils.

14. The apparatus of claim 9, wherein the electrostatic chuck is heated to a temperature greater than 200° C.

15. An apparatus comprising:
   an electrostatic chuck;
   a base, at a lower temperature than the electrostatic chuck;
   a thermal shield disposed between the electrostatic chuck and the base, where the thermal shield comprises a thermal insulator that is coated, on a side closer to the electrostatic chuck, with a layer of reflective material; and
   one or more washers, where the washers separate the thermal shield from the base.

16. The apparatus of claim 15, wherein the thermal insulator has a thickness of between 1 and 5 mils.

17. The apparatus of claim 15, wherein the layer of reflective material comprises aluminum.

18. The apparatus of claim 15, wherein the layer of reflective material is deposited on the thermal insulator using chemical vapor deposition, physical vapor deposition, plasma enhanced chemical vapor deposition or e-beam evaporation.

19. The apparatus of claim 15, wherein the layer of reflective material is between 30 and 100 nanometers.

* * * * *